United States Patent
Ballantyne et al.

(10) Patent No.: US 6,236,282 B1
(45) Date of Patent: May 22, 2001

(54) CRYSTAL REFERENCE AND OSCILLATOR CIRCUIT USING SAME

(75) Inventors: Wayne W. Ballantyne, Plantation; William J. Wingfield, Lauderhill; Atif Meraj, Plantation, all of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/264,578

(22) Filed: Mar. 8, 1999

(51) Int. Cl.[7] ................................. H03B 5/32
(52) U.S. Cl. .................. 331/158; 331/176; 331/116 R
(58) Field of Search ........................ 331/158, 176, 331/116 R, 66

(56) References Cited

U.S. PATENT DOCUMENTS 4,392,747 * 7/1983 Kumada et al. .................. 368/88
4,967,165 10/1990 Lee et al. .......................... 331/61

FOREIGN PATENT DOCUMENTS

405063443 * 3/1993 (JP) ............................ 331/158
406006134 * 1/1994 (JP) ............................ 331/158

* cited by examiner

Primary Examiner—Robert Pascal
Assistant Examiner—Kimberly Glenn
(74) Attorney, Agent, or Firm—Scott M. Garrett

(57) ABSTRACT

A crystal reference (100) comprises a crystal element (102) integrally housed with a memory device (108), and is coupled to the memory device through an anti-resonant network (110). The network is designed such that it presents a high impedance at the natural frequency of the crystal element. Temperature performance information for the particular crystal element is stored in the memory device, and is accessed via terminal (112) using a single wire interface protocol.

12 Claims, 3 Drawing Sheets

US 6,236,282 B1

CRYSTAL REFERENCE AND OSCILLATOR CIRCUIT USING SAME

TECHNICAL FIELD

This invention relates in general to oscillator circuits, and more particularly to crystal oscillator based circuits that provide temperature correction for producing a stable reference oscillator signal.

BACKGROUND OF THE INVENTION

The use of crystal devices to generate reference signals is well known, and well established in the art. They are available in a wide range of frequencies, and the techniques for using them and associated circuitry are likewise well known. It is also known that a crystal's electrical characteristics are temperature dependent, meaning that as the temperature of the crystal changes, so does its frequency. Generally this dependency is non-linear. In many applications the change of frequency over temperature is of little consequence. In other applications, however, it is critical to have a stable reference frequency. One area in which a stable reference frequency is critical is in radio communications, where frequency error resulting from temperature shift could put the radio device on an incorrect frequency channel, or cause numerous other problems.

There are two main ways of dealing with the effects of temperature in crystal based oscillators. The first method is to measure the specific temperature characteristics of each crystal, such as its Beckman's curve, and a store the information in the device in which the particular crystal is to be used in, so that the device can control the oscillator circuit accordingly and compensate for temperature effects. The second method again involves measuring temperature dependency information, but storing the information in a memory device integrally housed with the particular crystal element.

Perhaps the best example of the first method is the where a crystal manufacturer measures the temperature information at the time of manufacture, and prints the encoded information on the case of the crystal reference so that manufacturers who use the crystal can scan the crystal with an optical scanner, obtain the information, and program them into the device in which the crystal is being assembled. This is straightforward enough, but has the obvious problem in manufacturing of making sure the scanned part is actually placed into the corresponding device. It also make field replacement difficult because field offices must have the right scanning equipment, and be able to reprogram the device with new crystal information. Finally, it is preferable in sensitive electronic devices using crystals to place a faraday shield over the crystal to prevent interference. However, since the temperature information is printed on the crystal, a shield can not be placed until after the information has been read, complicating assembly operations.

The second method is in limited use because, by including a memory means with the crystal, the cost of producing the crystal reference increases. In addition, implementations of this method increase the number of electrical connections to the crystal reference to access the memory device. Additional electric terminals generally translate into more opportunities for failure, more complex circuit layout, and increased cost to manufacture the crystal. Therefore, there is a need for a crystal reference which overcomes these deficiencies associated with the prior art.

DETAILED DESCRIPTION OF A PREFERRED EMBODIMENT

Figure 1:
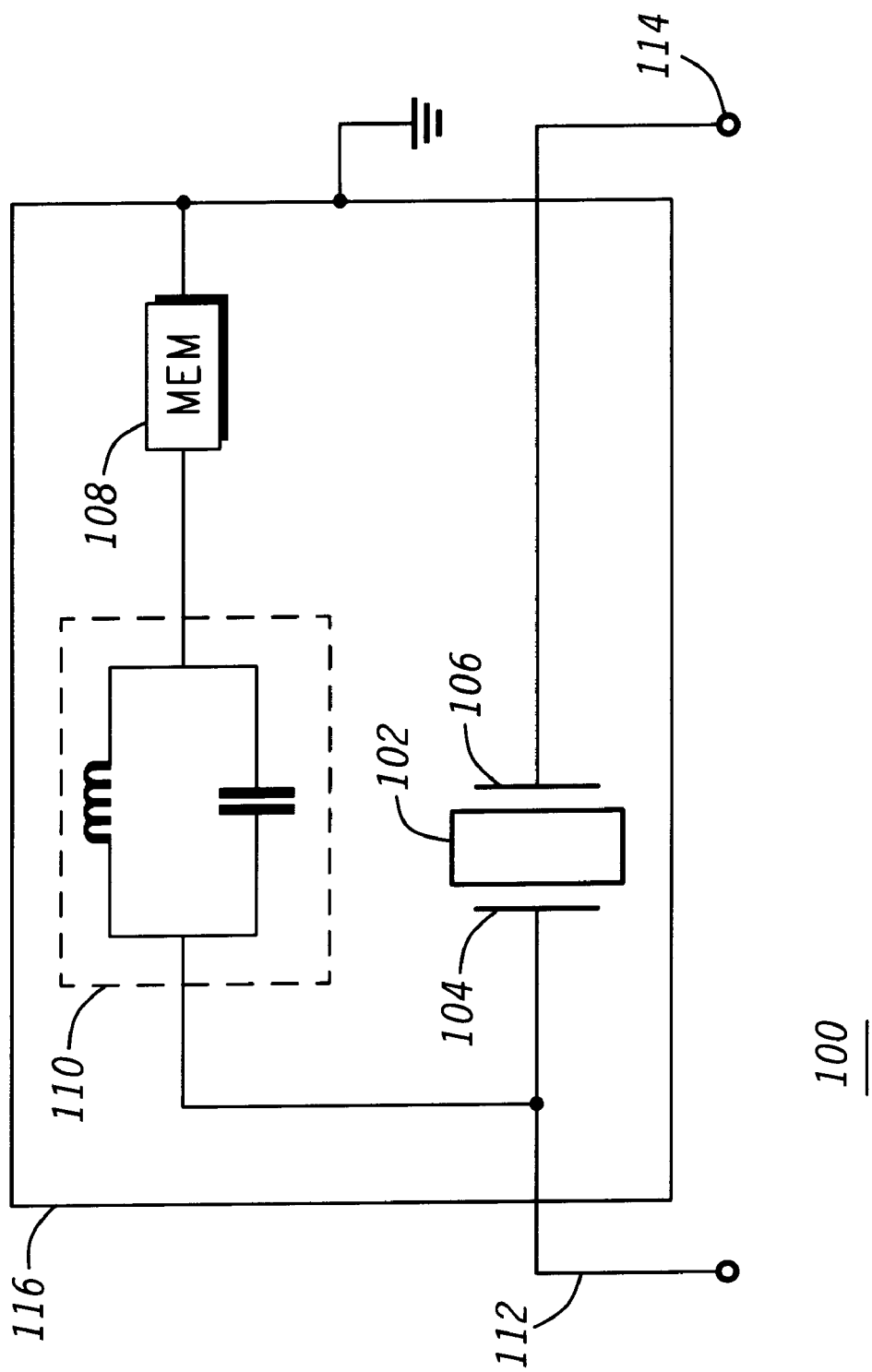
FIG. 1 shows a block diagram schematic of a crystal reference in accordance with the present invention.

While the specification concludes with claims defining the features of the invention that are regarded as novel, it is believed that the invention will be better understood from a consideration of the following description in conjunction with the drawing figures, in which like reference numerals are carried forward.

The present invention overcomes the prior art deficiencies by providing a memory means integrally with a crystal element, and having temperature information of the particular crystal element stored therein. However, this is accomplished without adding additional electrical connections compared to a standard two-terminal crystal reference. A unique oscillator circuit that is capable of extracting the information preferably uses a single wire interface protocol during initialization of the circuit.

Referring now to FIG. 1, there is shown a block diagram schematic of a crystal reference 100 in accordance with the present invention. The crystal reference comprises a crystal element 102, a first electrode 104 coupled to a first side of the crystal element, a second electrode 106 coupled to a second side of the crystal element, a memory device 108, and an anti-resonant network 110. The crystal element 102 has a natural frequency that it resonates at, which is dependent on temperature, and is typically an AT cut quartz piece, as is well known in the art. The first and second electrodes 104, 106 are coupled to the crystal element so that an electric potential may be applied thereto by means of external electrical connections at first and second terminals 112, 114, respectively. Preferably, the crystal element is disposed in an electrically conductive housing 116. The housing will be electrically grounded in the device in which it is assembled, so the crystal reference needs only three electrical connections.

Integrated in the housing with the crystal element is the memory device 108 and the anti-resonant network 110. The memory device is preferably an electronic memory device, using, for example, electrically erasable programmable read only memory (EEPROM) technology. Depending on the needs of the manufacturer, the memory may be a one-time programmable or a re-programmable memory. The memory device is coupled to the first electrode 104 and first terminal 112 through the anti-parallel network 110. The anti-parallel network appears as a high impedance at the natural frequency of the crystal element. A simple implementation of the anti-parallel network is a parallel inductor-capacitor (LC) tank circuit. It will be obvious to one skilled in the art that the anti-parallel network must be designed to appear as a high impedance over the natural frequency range of the crystal element corresponding to the intended operating temperature range.

The memory device 108 is preferably programmed at the time of manufacture of the crystal reference. The information stored therein would include temperature information profile, such as the parameters of the crystal element's Beckmann curve. It is also contemplated that tuning information used by the device into which the crystal reference is assembled may be stored in the memory device, either at the time of manufacture, upon assembly of the final device itself, or upon first operating the device.

To access the information stored in the device, electrical signals are passed through the anti-resonant network when the crystal element is not in use. In the preferred embodiment, the memory device communicates using a single wire interface protocol, and is accessed over the first terminal 112. An example of a memory device suitable for this purpose is that sold under the trade designation DS2502, manufactured by Dallas Semiconductor, Inc. As is known in the art, this type of memory device accumulates charge received from incoming signals, and uses this charge to operate, thus, no external voltage supply is needed to operate the memory device. The memory device must be grounded, such as by connecting a ground lead to the housing 116, which is then coupled to a ground potential in the final device.

Figure 2:
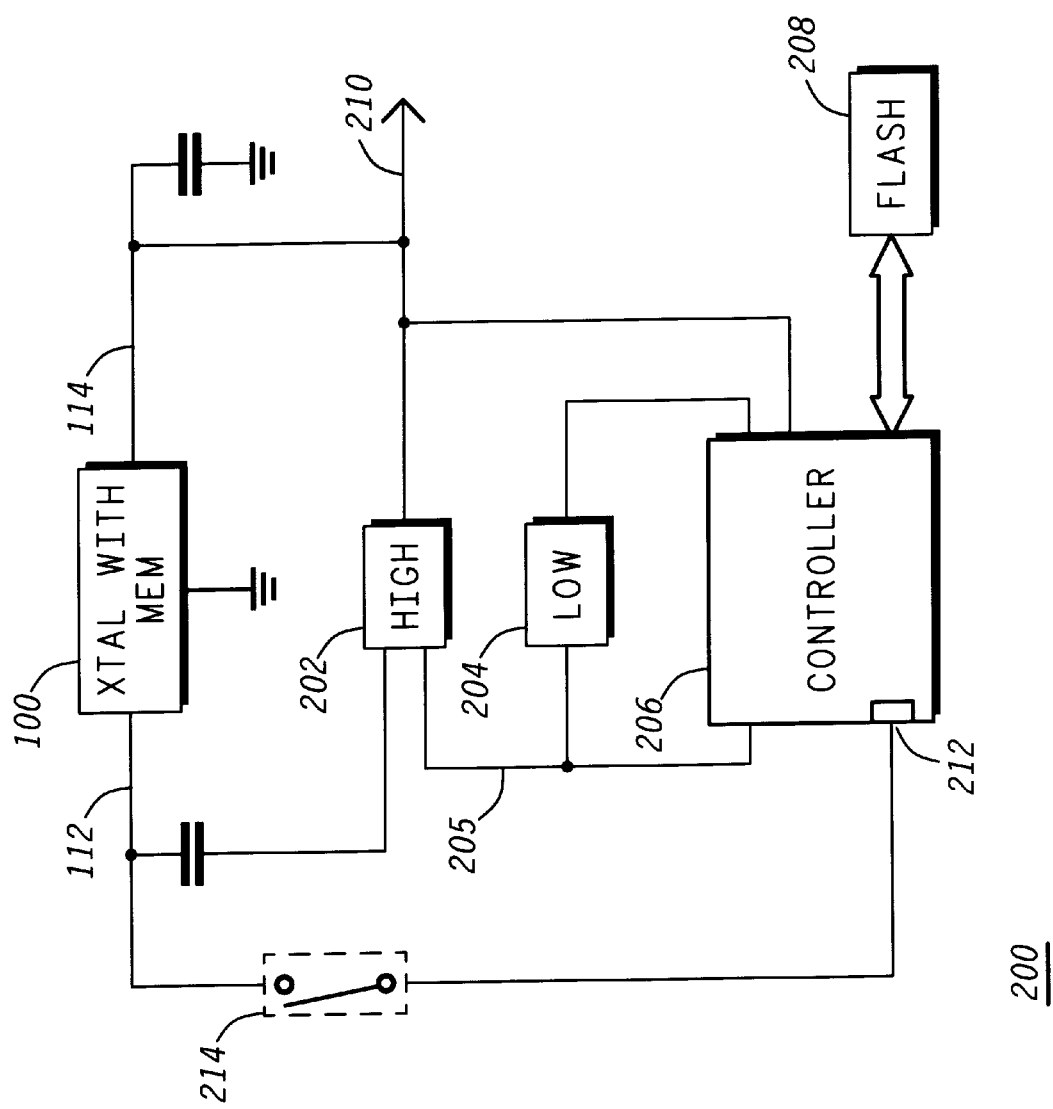
FIG. 2 shows a block diagram schematic of an oscillator circuit using a crystal reference, in accordance with the present invention.

Referring now to FIG. 2, there is shown a block diagram schematic of an oscillator circuit 200 using a crystal reference 100, in accordance with the present invention. This circuit would be used in, for example, a radio transceiver such as a cellular telephone. In addition to the crystal reference 100, the circuit comprises a high frequency oscillator 202 electrically coupled in parallel with the crystal reference for producing a stable reference oscillator signal; a low frequency oscillator 204 for producing a startup frequency signal having a startup frequency; a controller 206 for controlling operation of the high and low frequency oscillators; and an operating memory 208. The controller sends control signals over a control bus 205 to the high and low frequency oscillators. The high frequency oscillator uses the crystal reference to generate the stable reference oscillator signal that must be stable over temperature. Prior to initializing the high frequency oscillator, the controller first operates at the startup frequency generated by the low frequency oscillator, which is a self starting oscillator having an output 203 coupled to the controller. At that time the controller obtains the temperature profile information from the memory device disposed in the crystal reference, then stores the temperature profile information in the operating memory. The temperature information is also used by the controller to control and tune the high frequency oscillator to generate the stable reference oscillator signal, which is provided at a terminal 210.

The initialization process is only performed upon the first time the device in which the oscillator circuit is used is powered up, or upon the first power up upon replacing the crystal reference. Upon subsequent power up events, the controller reads the temperature profile information from the operating memory 208. The operating memory is a semi-permanent memory, such as a flash memory. After the initialization, the electrical connection between the crystal reference and the controller is opened, so as not to electrically load the output of the crystal reference. The opening can be accomplished, for example, by setting an I/O port 212 used by the controller to read the information from the crystal reference to a high impedance state, or by have a physical interruption of the electrical connection, such as by the use of a switch or fusible link 214.

Figure 3:
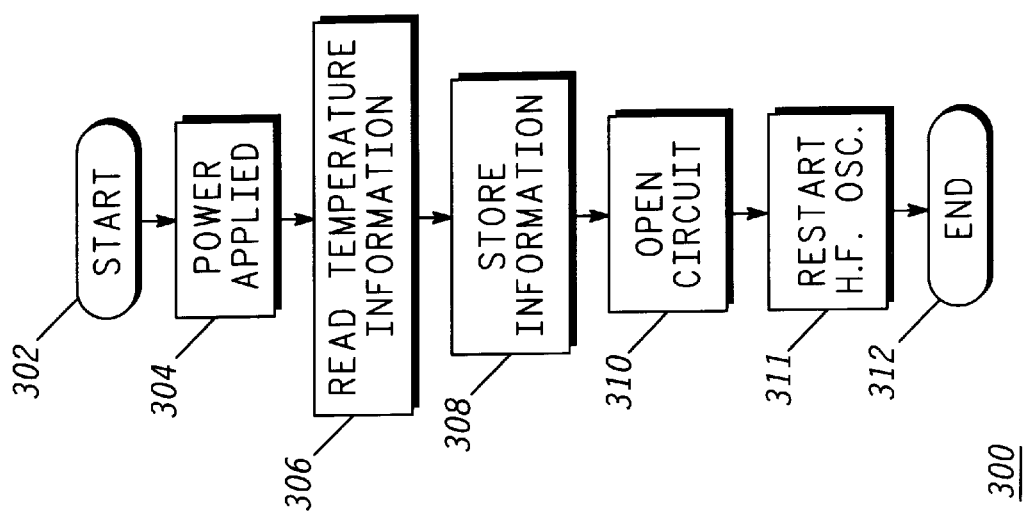
FIG. 3 shows a flow chart diagram of a method for initializing an oscillator circuit, in accordance with the present invention.

Referring now to FIG. 3, there is shown therein a flow chart diagram 300 of a method for initializing an oscillator circuit, in accordance with the present invention. At the start (302), the device in which the oscillator circuit of FIG. 2 has been assembled, and is ready to be initially powered up. The method is a method of initializing the oscillator circuit, and comprises providing (304) electric power to the oscillator circuit; reading (306) temperature profile information from the memory device disposed in the crystal reference; storing (308) the temperature profile information in an operating memory; and opening (310) the electrical connection between the controller and the crystal reference. Preferably, once the temperature information has been read by the controller, the high frequency oscillator is restarted (311). At the end (312), the device has the temperature information in the operating memory, and does not need to go through the initialization process subsequently.

Generally, while initializing the oscillator circuit, the low frequency oscillator 204 will run the controller by generating a startup frequency signal and providing it to the controller. After obtaining the temperature information from the memory device in the crystal reference, the controller will use the information in configuring the high frequency oscillator with the temperature profile information so that it may begin generating a stable reference oscillator frequency. However, before generating the stable reference oscillator frequency, the controller will take some step to open the electrical connection between the crystal reference and the controller, such as by setting an I/O port used to do the reading to a high impedance state.

Thus, the problem of excess electrical connections or terminal used in prior art crystal references with memory means is avoided. The problem of having to scan each crystal reference and track it with a particular circuit board or device assembly is also avoided. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A crystal reference for use in an oscillator circuit, comprising:
   a crystal element having a natural frequency;
   a first electrode coupled to a first side of the crystal element;
   a second electrode coupled to a second side of the crystal element;
   a memory device;
   an anti-resonant network electrically coupled between the first electrode and the memory device, and having a high impedance at the natural frequency of the crystal element; and
   an electrically conductive housing;
   wherein the crystal reference comprises exactly three different electrical connections.

2. A crystal reference as defined in claim 1, wherein the memory device has a single wire interface.

3. A crystal reference as defined in claim 1, wherein the memory device contains temperature profile information for the crystal element.

4. A crystal reference as defined in claim 1, wherein the memory device contains tuning information.

5. An oscillator circuit, comprising:
   a crystal reference, comprising:
      a crystal element having a natural frequency;
      a first electrode coupled to a first side of the crystal element;
      a second electrode coupled to a second side of the crystal element;
      a memory device having temperature profile information for the crystal element stored therein; and an anti-resonant network electrically coupled between the first electrode and the memory device, and having a high impedance at the natural frequency of the crystal element;

a high frequency oscillator electrically coupled in parallel with the crystal reference, and for producing a stable reference oscillator signal;

a low frequency oscillator for producing a startup frequency signal having a startup frequency;

a controller for controlling operation of the high and low frequency oscillators; and an operating memory;

wherein upon initializing the oscillator circuit, the controller operates at the startup frequency, obtains the temperature profile information from the crystal reference, then stores the temperature profile information in the operating memory.

6. An oscillator circuit as defined in claim 5, wherein the memory device of the crystal reference has a single wire interface.

7. An oscillator circuit as defined in claim 5, wherein the crystal reference is disposed in an electrically conductive housing.

8. An oscillator circuit as defined in claim 5, wherein the operating memory is a flash memory.

9. A method of initializing an oscillator circuit, comprising:

providing electric power to the oscillator circuit;

reading temperature profile information from a memory device disposed in a crystal reference, the reading performed by a controller over an electrical connection to an electrode coupled to a crystal element using a single wire interface protocol;

storing the temperature profile information in an operating memory; and opening the electrical connection between the controller and the crystal reference.

10. A method of initializing an oscillator circuit as defined in claim 9, further comprising generating a startup frequency signal between providing electric power and reading temperature profile information.

11. A method of initializing an oscillator circuit as defined in claim 9, further comprising:

configuring a high frequency oscillator with the temperature profile information; and generating a stable reference oscillator frequency.

12. A method of initializing an oscillator circuit as defined in claim 9, wherein the opening is performed by setting an I/O port used to do the reading to a high impedance state.

* * * * *